INVENTOR.
SAMUEL LUBKIN
BY S.C. Yuter
ATTORNEY.

March 18, 1958 S. LUBKIN 2,827,566

FREQUENCY CHANGER

Filed Dec. 30, 1954 2 Sheets-Sheet 2

GATE 122

GATE 122

BUFFER 146

BUFFER 146

PULSE AMPLIFIER 190

PULSE AMPLIFIER 190

RESHAPER 228

DELAY LINE 271

INVENTOR
SAMUEL LUBKIN

BY S.C. Yuter

ATTORNEY 2,827,566
Patented Mar. 18, 1958

2,827,566

FREQUENCY CHANGER

Samuel Lubkin, Bayside, N. Y., assignor to Underwood Corporation, New York, N. Y., a corporation of Delaware Application December 30, 1954, Serial No. 478,831

19 Claims. (Cl. 250—27)

Figure 1A:
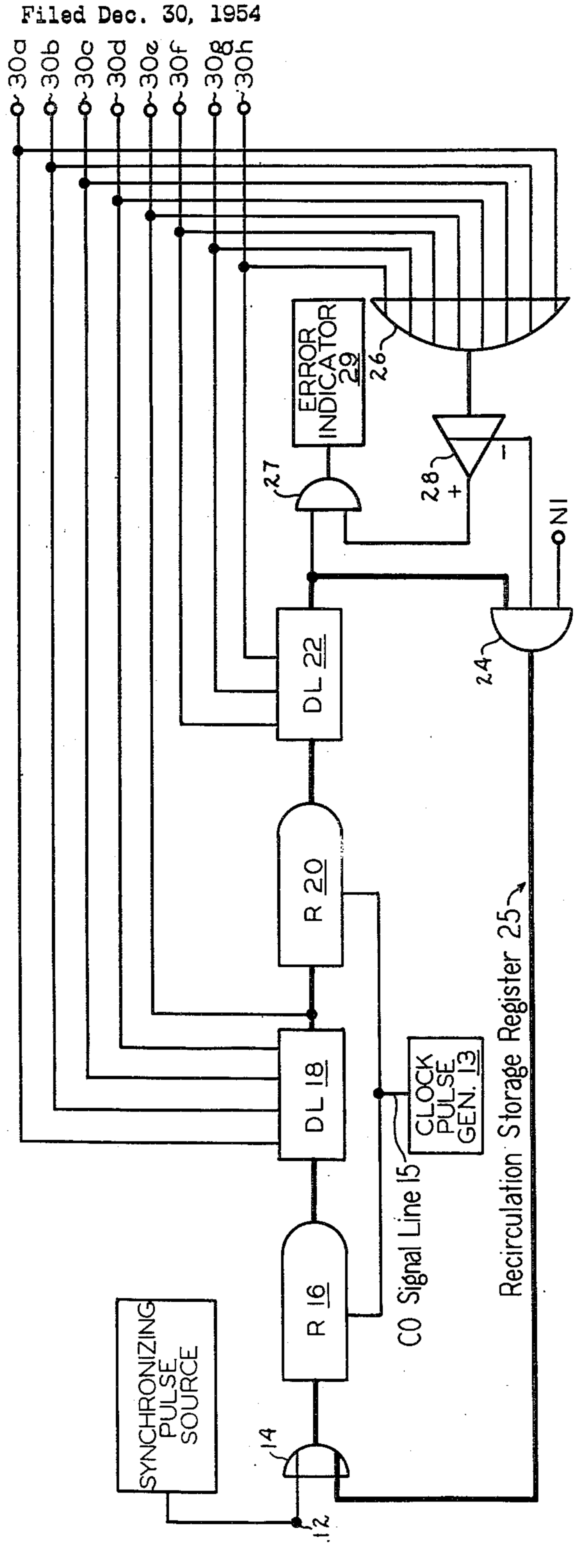

This invention relates to frequency changers and more particularly to frequency changers employing recirculating storage devices.

Recirculating storage devices comprise regeneration units and delay units. A pulse from a primary pulse source having a fixed frequency or pulse repetition rate is introduced into a regeneration unit and then fed to a delay unit. The pulse remains in the delay unit a length of time equal to a chosen multiple or submultiple of the period of the primary pulse source. At the end of this period of time the pulse is fed from the delay unit back into the input of the regeneration unit.

Recirculating storage devices maintain the constant recirculation of an inserted pulse. Hence once a pulse is inserted it should occur with a periodicity equal to the chosen multiple or submultiple of the period of the primary pulse signal.

As an illustrative example, assume that a division by ten of the primary pulse frequency is desired. The time chosen to delay the pulse in the recirculating storage device is ten times the period of the primary pulse signal. Then a pulse which is inserted will be present at the output terminal of the delay unit every ten periods of the primary pulse signal. Hence, it is possible to generate a pulse signal in synchronism with the primary pulse but occurring at a frequency one tenth as often. Thus, the pulse repetition rate of the output pulse will be one tenth of the pulse repetition rate of the primary pulse source.

Although the problem of frequency changing is readily solved by recirculating storage devices, the use of regeneration units in such devices leads to the creation of a new problem.

Assume that a desired pulse is circulating in the storage device and that a voltage surge occurs causing a transient waveform to appear somewhere in the recirculating storage device. If the transient waveform reaches the input of the regeneration unit it can be formed into a pulse. There is thus a possibility of more than one pulse circulating in the storage register. An extraneous or spurious pulse can cause the generation of undesired signals.

Similarly, the generation of undesired signals may occur when the equipment is initially turned on. Initial voltage surges can cause transients which when received by the regeneration unit are formed into pulses which then circulate in the recirculating storage devices.

In either case, spurious signals are created which may cause the apparatus to operate in an erroneous manner.

It is therefore an object of the invention to provide an improved frequency changer which employs a recirculating storage device.

It is another object of the invention to provide an improved frequency changer employing a recirculating storage device which only permits the desired signals to circulate.

It is a further object of the invention to provide an improved frequency changer employing a recirculating storage device which is capable of automatically deleting all spurious pulses in the recirculating storage device.

In accordance with the invention, a recirculation storage device is provided for frequency changing which includes means responsive to signals circulating in the recirculating storage device to block the recirculation path in order to delete spurious signals.

A feature of the invention is an indicator which indicates the occurrence of a spurious signal.

It should be noted that frequency changers of the type herein described are capable of generating pulse patterns more complex than a pulse signal whose frequency is some submultiple of a primary pulse source. For example, by connecting two output terminals to different locations in the recirculating storage device it is possible to generate a pair of pulses whose frequency is some submultiple of a primary pulse source while the time between the occurrence of the first and second pulses of the pair is any value from coincidence to just less than the period of the waveform.

Other objects, features and advantages will appear in the subsequent detailed description of the invention, wherein:

Fig. 1*a* shows symbolically a frequency changer employing a recirculating storage device in accordance with the preferred embodiment of the invention.

Figure 1B:
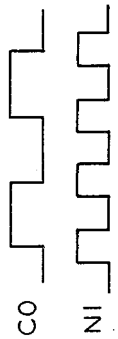

Fig. 1*b* shows the waveforms of pulse signals employed in the apparatus.

Figs. 2*a* to 6*a* illustrate the block symbols employed in Fig. 1*a*. Figs. 2*b* to 6*b* show the details of the corresponding block symbol.

Figure 2A:
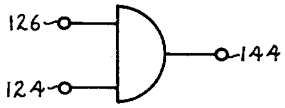

Fig. 2*a* is the symbolic representation of a gate.

Figure 2B:
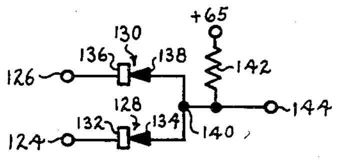

Fig. 2*b* schematically shows the gate of Fig. 2*a*.

Figure 3A:
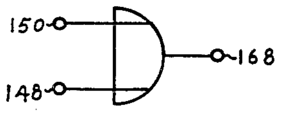

Fig. 3*a* shows in symbolic form a buffer.

Figure 3B:
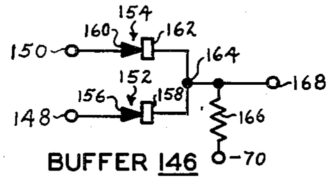

Fig. 3*b* is the schematic diagram of the buffer of Fig. 3*a*.

Figure 4A:
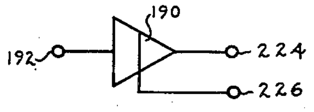

Fig. 4*a* symbolically illustrates a pulse amplifier.

Figure 4B:
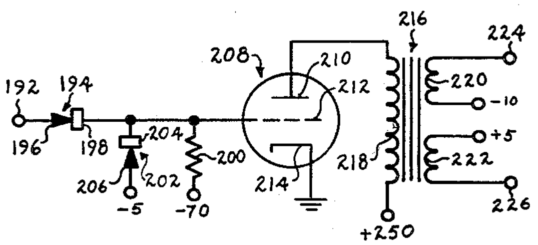

Fig. 4*b* is the schematic diagram of the pulse amplifier of Fig. 4*a*.

Figure 5A:
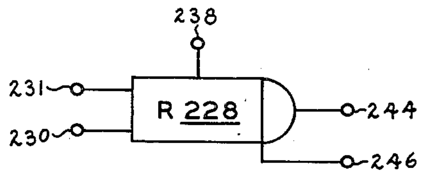

Fig. 5*a* shows a reshaper in symbolic form.

Figure 5B:
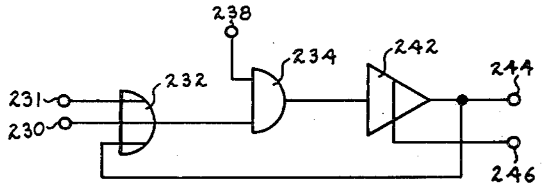

Fig. 5*b* illustrates the reshaper of Fig. 5*a* by using the above shown symbols.

Figure 6A:
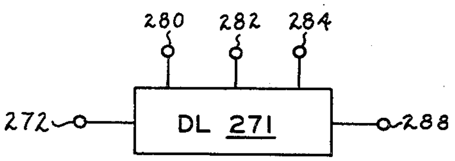

Fig. 6*a* shows the symbol for a delay line.

Figure 6B:
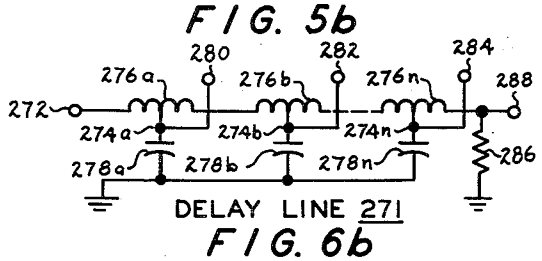

Fig. 6*b* is the schematic representation of a delay line.

Referring to the frequency changer shown in Fig. 1*a*, a preferred embodiment of the invention is shown comprising the synchronizing signal terminal 12, the buffers 14 and 26, the gates 24 and 27, the reshapers 16 and 20, the delay lines 18 and 22 with the terminals 30, the pulse amplifier 28 and the error indicator 29.

Each of the buffers 14 and 26 is an electrical network which transmits the most positive potential which is present at the associated input terminals.

Each of the gates 24 and 27 is a coincident circuit which transmits the least positive voltage present at the associated input terminals.

Each of the reshapers 16 and 20 is a regenerative amplifier which upon receipt of a signal at its input terminal passes a well defined and precisely timed pulse. Each of the reshapers 16 and 20 receives the primary pulse signal via CO line 15 from a clock pulse generator 13. The reshapers 16 and 20 are so designed that there is an inherent fixed lapse of time between the receipt of a pulse at the associated input terminal and the transmission of a pulse from the associated output terminal.

Each of the delay lines 18 and 22 are electrical networks capable of receiving a pulse at its input terminal and of transmitting the pulse at a later time from the associated output terminal. The delay lines 18 and 22 also have intermediate output terminals or "taps" 30 for providing varied periods of delay time.

The pulse amplifier 28 is an electronic circuit which functions to provide positive and negative signals. When no signal is present at the input terminal of the pulse amplifier 28 the negative output terminal of the pulse amplifier is at a positive potential and the positive output terminal is at a negative potential. When a pulse is present at the input terminal of the amplifier, the negative output terminal assumes a negative potential and the positive output terminal a positive potential.

All of the above mentioned components will be more fully described and illustrated below.

Several signals are required for the operation of the apparatus, but since means for generating these signals are well known in the art only a brief description will be given.

Fig. 1*b* shows the CO and N1 signals which are employed in the apparatus.

The CO signal (the primary pulse signal) is supplied by a standard clock pulse generator. The CO signal is a constant frequency square-wave. In the description of the operation of the apparatus delay times will be specified in units of the time duration of the CO signal, i. e., a one pulse time delay is equal to the period of the CO signal. The N1 signal, related to the CO signal, is a square-wave signal of twice the frequency of the CO signal. Fig. 1*b* also shows the phase relations of the CO and N1 signals.

The output terminal of the buffer 14 is connected to the input terminal of reshaper 16 whose output terminal is connected to the input terminal of the delay line 18. The output terminal of the delay line 18 is coupled to the input terminal of the reshaper 20. The output terminal of the reshaper 20 is connected to the input terminal of the delay line 22. The output terminal of the delay line 22 is coupled to an input terminal of the gate 24. The output terminal of the gate 24 is connected to an input terminal of the buffer 14.

It should be noted that the apparatus connected in the above described manner constitutes a closed loop. Such a closed loop is known in the art as a recirculation storage register and will hereinafter be designated as recirculation storage register 25. The recirculation path is indicated in Fig. 1*a* with heavy lines.

The several "taps" 30 connected to the delay lines 18 and 22 are used for the signal output terminals of the apparatus and are also connected to the input terminals of the buffer 26. The output terminal of the buffer 26 is connected to the input terminal of the pulse amplifier 28. The negative output terminal of the pulse amplifier 28 is coupled to an input terminal of the gate 24.

The positive output terminal of the pulse amplifier 28 is connected to an input terminal of the gate 27. The second input terminal of the gate 27 is coupled to the output terminal of the delay line 22. The output terminal of the gate 27 is connected to an error indicator 29.

Referring to Fig. 1*a*, the system will first be described as functioning without an error. A synchronizing pulse enters buffer 14 via the synchronizing signal terminal 12. The pulse is then fed to reshaper 16 where after about a quarter of a pulse time a positive pulse is fed from the positive output terminal of reshaper 16 to the input terminal of the delay line 18. The pulse is then transmitted down delay 18. The pulse will be present at tap **30*a* of delay line 18 three quarters of a pulse time after the pulse entered delay line 18. The pulse will also be present at tap 30*b* one pulse time after being present at tap 30*a*, at tap 30*c* a pulse time after its appearance at 30*b*, at 30*d* another pulse time later and at 30*e* still another pulse time later. Hence four and three quarter pulse times after the pulse entered delay line 18, the pulse is fed to reshaper 20**.

Reshaper 20, operating in the same manner as reshaper 16, delays the pulse one-quarter pulse time and transmits a positive pulse to delay line 22.

The positive pulse first appears at tap **30*f* three quarters of a pulse time after entering delay line 22. The pulse appears at tap 30*g* a pulse time after appearing at tap 30*f* and appears at tap 30*h*** a pulse time after that.

Finally, the pulse leaves delay line 22 three and three quarters pulse times after entering delay line 22 and is fed to gate 24. For the present, it will be assumed that the negative output terminal of pulse amplifier 28 is at a positive potential (this is the condition for error-free operation). Gate 24 will then pass a pulse equivalent to an N1 signal. This pulse is fed to reshaper 16 via buffer 14 and the cycle is complete.

It should be noted that the recirculation storage register 25 has a delay of nine pulse times so that after the synchronizing pulse enters buffer 14 a pulse again appears at the output of buffer 14 nine pulse times later. If no more synchronizing pulses are fed to buffer 14 via input terminal 12 a single pulse will circulate in the apparatus, with the period of occurrence at any point in the apparatus being nine pulse times.

If, as is the usual case, the synchronizing pulses have a fixed period of occurrence and this period is in integral multiple of the period of occurrance of the pulse circulating in the apparatus, it is easily seen that only one pulse will still circulate in the apparatus.

As an example, assume the period of the synchronizing pulse signal is ninety pulse times. If a synchronizing pulse signal is initially fed to buffer 14 via synchronizing pulse terminal 12, the pulse after circulating ten times in the apparatus will appear at buffer 14 ninety pulse times later and be in coincidence with the next synchronizing pulse being fed to buffer 14. It should also be noted that by selecting various combinations of the taps 30 and connecting these to buffers various periodic waveforms can be generated.

The functioning of the apparatus will now be described when an error has occurred. Assume that the single pulse has been circulating in the apparatus and that a second waveform enters the system because of some transient condition. Once this second waveform passes through either of the reshapers 16 or 20 the waveform can become a pulse synchronous with pulses handled by the apparatus. (Actually, since the total delay in the recirculating storage register 25 is nine pulse times the capacity is nine pulses; therefore, it is possible for nine pulses to be present in the device at one time.)

When either of the pulses now circulating in the apparatus is present at any of the taps 30 a pulse is fed via buffer 26 to pulse amplifier 28. During the presence of this pulse the negative output terminal of pulse amplifier 28 assumes a negative potential which prevents any positive pulse from passing through gate 24. Thus gate 24 intermittently blocks the recirculation path of the recirculation storage register 25.

Within the next nine pulse times one of the two pulses will be present at gate 24 simultaneously with an N1 pulse. At this same time, the other pulse will be present at one of the taps 30. The pulse present at a tap 30 is fed via buffer 26 to pulse amplifier 28 and the negative output terminal of pulse amplifier 28 assumes a negative potential blocking gate 24 thus causing the deletion of the first pulse. The pulse that had caused the blocking now circulates alone in the apparatus. In this manner gate 24 selectively blocks the recirculation path of the recirculation storage register 25.

Coincident with the blocking of the pulse from the output terminal of delay line 22 at gate 24 by the negative output terminal of pulse amplifier 28 the positive output terminal of the pulse amplifier 28 allows the pulse from the output terminal of delay line 22 to pass through gate 27 to the error indicator 29. In one form the error indicator 29 can be a neon indicating device. In the computer art, for example, the error indicator 29 would be used to halt the operation of the computer.

The possibility arises that the pulse that has been deleted was the original pulse fed into the apparatus. In this case, the pulse resulting from the transient disturbance then circulates in the apparatus. The pulse will continue to circulate until another synchronizing pulse signal is fed to buffer 14 via the synchronizing pulse terminal 12. When the synchronizing pulse signal enters the apparatus and is present at the taps 30 the pulse that had been circulating will be deleted in the manner explained above. Hence within a maximum time equal to the period of the synchronizing pulse signal the waveforms generated by the apparatus will return to precise synchronism with the synchronizing pulse signals.

When the total time of delay in the recirculating storage register 25 is some fractional multiple of the period of the synchronizing signals, the function of the apparatus can be interpreted as a frequency multiplier. For example, if the synchronizing pulse occurs once every ninety pulse times and the time of delay in the recirculating storage register is nine pulse times then the frequency of pulses occurring in the recirculating storage device will be ten times the frequency of the synchronizing pulse.

Thus, in accordance with the invention, a frequency changer has been provided which employs a recirculating storage device and which operates with a minimum possibility of retaining an error for long periods of time. Further, the apparatus is capable without external manipulation of correcting errors which occur when the apparatus is turned on and while the apparatus functions. In addition, means are provided for indicating the occurrence of an error.

It should be noted that the above described frequency changer can be employed in the art of digital computers where frequency dividers are often used to generate groups of pulses whose frequency of occurrence is an integral submultiple of the frequency of a primary pulse source. The primary pulse source is a basic reference signal to which many of the control signals generated by the computer are synchronized.

Digital computers of the serial type use a group of control signals called timing signals. These timing signals are employed in the switching and modification of the pulse patterns representing information within the computer. Since the switching and modifying operations in the computer are complex and interdependent it is necessary to maintain an exact order to the sequence of these operations.

The order of the sequence of operations is maintained by the timing pulses which are derived from the primary pulse source.

*Description of symbols*

The schematic equivalents of the symbols which were employed to simplify the detailed description of the units of the frequency dividing system which was illustrated in block form are shown in Figs. 2*a* through 6*a*. For convenient reference, all positive and negative supply buses will generally be identified with a number corresponding with their voltage. The circuitry terminals corresponding to the same symbol terminals are shown in Figs. 2*b* to 6*b*.

*Gate*

The gates used in the apparatus are of the "coincidence" type, each comprising a crystal diode network which functions to receive input signals via a pluarlity of input terminals and to pass the most negative signal.

The symbol for a representative gate 122, having two input terminals 124 and 126, is shown in Fig. 2*a*. In the apparatus the signal potential levels are plus five volts (positive signals) and minus ten volts (negative signals), the potentials of the signals which may exist at the input terminals 124 and 126 are thereby limited.

If a potential of minus ten volts is present at one or both of the input terminals 124 and 126, a potential of minus ten volts exists at the output terminal 144. Therefore, if one of the input signals to the input terminals 124 and 126 is positive and the other signal is negative, the negative signal is passed and the positive signal is "blocked."

When there is a coincidence of positive signals at the two input terminals 124 and 126, a positive signal is transmitted from the output terminal 144. In such case, it may be stated that a positive signal is "gated" or "passed" by the gate 122.

The schematic details of the gate 122 are shown in Fig. 2*b*. Gate 122 includes the crystal diodes 128 and 130. Each of the input terminals 124 and 126 is coupled to one of the crystal diodes 128 and 130. Crystal diode 128 comprises the cathode 132 and the anode 134. Crystal diode 130 comprises the anode 138 and the cathode 136. More particularly, the input terminals 124 and 126 are respectively coupled to the cathode 132 of the crystal diode 128 and the cathode 136 of the crystal diode 130. The anode 134 of the crystal diode 128 and the anode 138 of the crystal diode 130 are interconnected at the junction 140. The anodes 134 and 138 are coupled via the resistor 142 to the positive voltage bus 65.

If negative potentials are simultaneously present at the input terminals 124 and 126, both of the crystal diodes 128 and 130 conduct, since the positive supply bus 65 tends to make the anodes 134 and 138 more positive. The voltage at the junction 140 will then be minus ten volts since, while conducting, the anodes 134 and 138 of the crystal diodes 128 and 130 assume the potential of the associated cathodes 132 and 136.

When a positive signal is fed only to the input terminal 124, the cathode 132 is raised to a positive five volts potential and is made more positive than the anode 134, so that crystal diode 128 stops conducting. As a result, the potential at the junction 140 remains at the negative ten volts level. In a similar manner, when a positive signal is only present at the input terminal 126, the voltage at the junction 140 will not be changed.

When the signals present at both input terminals 124 and 126 are positive, the anodes 134 and 138 are raised to approximately the same potential as their associated cathodes 132 and 136 and the potential at the junction 140 rises to a positive potential of five volts.

The potential which exists at the junction 140 is transmitted from the gate 122 via the connected output terminal 144.

In the above described manner, the gate 122 is frequently used as a switch to govern the passage of one signal by the presence of one or more signals which control the operation of the gate 122.

It should be understood that the potentials of plus five volts and minus ten volts used for purpose of illustration are approximate, and the exact potentials will be affected in two ways. First, they will be affected by the value of the resistance 142 and its relation to the impedances of the input circuits connected to the impedances of the input circuits connected to the input terminals 124 and 126. Second, they will be affected by the fact that a crystal diode has some resistance (i. e., is not a perfect conductor) when its anode is more positive than its cathode, and furthermore will pass some current (i. e., does not have infinite resistance) when its anode is more negative than its cathode. Nevertheless, the assumption that signal potentials are either plus five or minus ten volts is sufficiently accurate to serve as a basis for the description of the operations taking place in the apparatus.

A clamping diode may be connected to the output terminal 144 to prevent the terminal from becoming more negative than a predetermined voltage level to protect the diodes 128 and 130 against excessive back voltages and to provide the proper voltage levels for succeeding circuits.

*Buffer*

The buffers used in the apparatus are also known as "or" gates. Each buffer comprises a crystal diode network which functions to receive input signals via a plurality of input terminals and to pass the most positive signal.

The symbol for a representative buffer 146, having two input terminals 148 and 150, is shown in Fig. 3*a*. Since the signal potential levels in the system are minus ten volts and plus five volts, either one of these potentials may exist at the input terminals 148 and 150.

If a positive potential of five volts exists at one or both of the input terminals 148 or 150, a positive potential of five volts exists at the output terminal 168. If a negative potential of ten volts is present at both of the input terminals 148 and 150, a negative potential of ten volts will be present at the output terminal 168.

The schematic details of the buffer 146 are shown in Fig. 3*b*. The buffer 146 includes the two crystal diodes 152 and 154. The crystal diode 152 comprises the anode 156 and the cathode 158. Crystal diode 154 comprises the anode 160 and the cathode 162. The anode 156 of the crystal diode 152 is coupled to the input terminal 148. The anode 160 of the crystal diode 154 is coupled to the input terminal 150. The cathodes 158 and 162 of the crystal diodes 152 and 154, respectively, are joined at the junction 164 which is coupled to the output terminal 168, and via the resistor 166 to the negative supply bus 70. The negative supply bus 70 tends to make the cathodes 158 and 162 more negative than the anodes 156 and 160, respectively, causing both crystal diodes 152 and 154 to conduct.

When negative ten volt signals are simultaneously present at input terminals 148 and 150, the crystal diodes 152 and 154 are conductive, and the potential at the cathodes 158 and 162 approaches the magnitude of the potential at the anodes 156 and 160. As a result, a negative potential of ten volts appears at the output terminal 168.

If the potential at one of the input terminals 148 or 150 increases to plus five volts, the potential at the junction 164 approaches the positive five volts level as this voltage is passed through the conducting crystal diode 152 or 154 to which the voltage is applied. The other crystal diode 152 or 154 stops conducting since its anode 156 or 160 becomes more negative than the junction 164. As a result, a positive potential of five volts appears at the output terminal 168.

If positive five volt signals are fed simultaneously to both input terminals 148 and 150, a positive potential of five volts appears at the output terminal 168, since both crystal diodes 152 and 154 will remain conducting. Thus the buffer 146 functions to pass the most positive signal received via the input terminals 148 and 150.

*Pulse amplifier*

The symbol for a representative pulse amplifier is shown in Fig. 4*a*. When a positive pulse is fed to the pulse amplifier 190 via the input terminals 192, the pulse amplifier 190 functions to transmit a positive pulse which swings from minus ten to plus five volts from its positive output terminal 224, and a negative pulse which swings from plus five to minus ten volts from its negative output terminal 226. At all other times, the pulse amplifier 190 has a negative potential of ten volts at its positive output terminal 224 and a positive potential of five volts at its negative output terminal 226.

The detailed circuitry of the pulse amplifier 190 is shown in Fig. 4*b*. The pulse amplifier 190 includes the vacuum tube 208, the pulse transformer 216 and associated circuitry. The vacuum tube 208 comprises the cathode 214, the grid 212 and the anode 210. The pulse transformer comprises the primary winding 218 and the secondary windings 220 and 222.

The crystal diode 194 couples the grid 212 of the vacuum tube 208 to the input terminal 192, the anode 196 of the crystal diode 194 being coupled to the input terminal 192 and the cathode 198 being coupled to the grid 212. The negative supply bus 70 is coupled to the grid 212 via the resistor 200 and tends to make the crystal diode 194 conductive. The grid 212 and the cathode 198 of the crystal diode 194 are also coupled to the cathode 204 of the crystal diode 202, whose anode 206 is coupled to the negative supply bus 5. The crystal diode 202 clamps the grid 212 at a potential of minus five volts thus preventing the voltage applied to the grid 212 from becoming more negative than mius five volts.

When a voltage more positive than minus five volts is transmitted to the input terminal 192, the crystal diode 194 conducts and the voltage is applied to the grid 212. Since the crystal diode 202 clamps the grid 212 and the cathode 198 of the crystal diode 194 at minus five volts, any voltage more negative than minus five volts will cause the crystal diode 194 to become nonconductive, and that input voltage will be blocked at the crystal diode 194. Thus, the clamping action of the crystal diode 202 will not affect the circuitry which supplies the input voltage.

The cathode 214 of the vacuum tube 208 is connected to ground potential. The anode 210 of the vacuum tube 208 is coupled by the primary winding 218 of the pulse transformer 216 to the positive supply bus 250. The outer ends of the secondary windings 220 and 222 of the pulse transformer 216 are coupled respectively to the positive output terminal 224 and the negative output terminal 226. The inner ends of the secondary windings 220 and 222 are coupled respectively to the negative supply bus 10 and the positive supply bus 5.

A positive pulse which is fed to the grid 212 of the vacuum tube 208 will be inverted at the primary winding 218 of the pulse transformer 216 which is wound to produce a positive pulse in the secondary winding 220 and a negative pulse in the secondary winding 222. These pulses respectively drive the positive output terminal 224 up to a positive five volts potential and the negative output terminal 226 down to a negative ten volts potential because of the circuit parameters.

When the vacuum tube 208 is non-conducting, the negative ten volts potential is fed through the secondary winding 220 and appears at the positive output terminal 224. At the same time, the positive five volts potential is fed through the secondary winding 222 to the negative output terminal 226. These latter conditions are the normally existing conditions at the output terminals 224 and 226.

*Reshaper*

A rehaper of the type used in the apparatus is an electronic circuit which functions to reshape and retime positive pulses which have become poorly shaped and attenuated.

The symbol for a representative reshaper 228 is illustrated in Fig. 5*a* and comprises one or more input terminals of which the input terminals 230 and 231 are shown, timing terminal 238 which receives reshaping and retiming pulses (also designated clocking or C pulses), positive output terminal 244 and negative output terminal 246.

Except when positive pulses are fed to the input terminals 230 and 231 of the reshaper 228, a negative potential of ten volts is present at the positive output terminal 244 and a positive potential of five volts exists at the negative output terminal 246.

When a pulse is fed to the reshaper 228 via one or both of the input terminals 230 and 231, the pulse is reshaped by a clock pulse (received via the terminal 238), which is timed to delay the reshaped pulse for one-quarter of a pulse time, and is then transmitted from the reshaper 228 via the positive output terminal 244. While the positive pulse is being transmitted from the positive output terminal 244, a negative pulse is transmitted from the negative output terminal 246.

The detailed circuitry of the reshaper 228 is illustrated in Fig. 5*b* in which use is made of logical symbols previously described.

The reshaper 228 comprises the buffer 232, the gate 234 and the pulse amplifier 242 connected in series. A positive pulse which is fed via one or both of the input terminals 230 and 231 of the buffer 232 is passed to the gate 234.

A series of identical clock pulses which are generated in the clock pulse generator are transmitted to the gate 234 via the clock terminal 238. The clock pulses are equal in magnitude and width to the desired shape and timing of the pulses which are to be reshaped and retimed. The clock pulses are timed so that the starting time of each clock pulse coincides approximately with the center of the pulse it is intended to reshape. This is done to assure that the pulse to be reshaped will have reached its maximum amplitude by the time the leading edge of a clock pulse arrives at the gate 234. Since in many cases the pulse to be reshaped is originally produced by a previous reshaper and thus has approximately the same width as a clock pulse, its center point will be one-quarter pulse time later than the leading edge of the clock pulse which previously reshaped it. Hence its leading edge after passing through the new reshaper will be one-quarter pulse time later than before, and on this basis it may be said that a reshaper introduces a one-quarter pulse time delay in the signals passing through it.

When the attenuated positive pulse reaches its full magnitude at the gate 234, the coinciding clock pulse is gated through to the amplifier 242 and is amplified and causes a positive pulse to be transmitted from the positive output terminal 244, and a negative pulse to be transmitted from the negative output terminal 246 at the same time.

The positive output terminal 244 is also coupled to one input of the buffer 232 so that a positive signal which appears at the positive output terminal 244 is regenerative and will continue to exist until the clock pulse terminates at the gate 234. This effectively permits the entire clock pulse to be gated through the gate 234, even though the original pulse has decayed before the end of the clock pulse.

Stated more generally, a clock pulse is passed through the gate 234 from the earliest coincidence of that clock pulse with the full magnitude of the attenuated pulse until the termination of that clock pulse. As a result, a clock pulse is substituted for the attenuated pulse in the system after a delay of one-quarter of a pulse time.

*Delay line*

The symbol for a representative electrical delay line 271 which is a lumped parameter type delay line and which functions to delay received pulses for discrete periods of time, is shown in Fig. 6*a*.

The delay line 271 comprises the input terminal 272, the output terminal 288, and a plurality of taps 280, 282 and 284. A pulse which is fed via the input terminal 272 to the delay line 271 will be delayed for an increasing number of pulse times before successively appearing at the taps 280, 282 and 284. When the pulse reaches the output terminal 288, the total delay provided by the delay line 271 has been applied.

The delay line 271 shown in Fig. 6*b* comprises a plurality of inductors 276 connected in series, with the associated capacitors 278 which couple a point 274 on each inductor 276 to ground. A signal is fed into the delay line 271 at the input terminal 272 and the maximum delay occurs at the output terminal 288. The taps 280, 282 and 284 are each connected to one of the points 274 and provide varied delays. The delay line 271 is terminated by a resistor 286 in order to prevent reflections. Although in the delay line of Fig. 6*b* a tap is shown connected to each of the points 274, it should be understood that in actual practice there are ordinarily several untapped points 274 between successive taps.

There will now be obvious to those skilled in the art many modifications and variations utilizing the principles set forth and realizing many or all of the objects and advantages of the circuits described but which do not depart essentially from the spirit of the invention.

What is claimed is:

1. Apparatus for changing the pulse repetition rate of pulses from a pulse source comprising a delay device responsive to pulses from said pulse source to generate pulses at a different repetition rate, said delay device including retiming means, and means responsive to the pulses circulating in said delay device for deleting spurious signals.

2. Apparatus for changing the pulse repetition rate of pulses from a pulse source comprising a delay device responsive to pulses from said pulse source to generate pulses at a different repetition rate, said delay device including retiming means, and means responsive to the pulses circulating in said delay device for deleting extraneous signals, and for indicating the occurrence of a spurious signal.

3. Apparatus for changing the pulse repetition rate of pulses from a pulse source comprising a delay device responsive to pulses from said pulse source to generate pulses at a different repetition rate, said delay device including retiming means, and means responsive to the pulses circulating in said delay device for selectively deleting spurious signals.

4. Apparatus for changing the pulse repetition rate of a pulse source comprising a delay device responsive to pulses from said pulse source to generate pulses at a different repetition rate, said delay device including retiming means, and means responsive to the pulses circulating in said delay device for selectively deleting extraneous signals.

5. Apparatus for changing the pulse repetition rate of pulses from a pulse source comprising a recirculation storage device responsive to pulses from said pulse source to generate pulses at a different repetition rate, said recirculation storage device including retiming means, and means responsive to the pulses circulating in said recirculation storage device for interrupting the recirculation path of said recirculation storage device for deleting spurious signals.

6. Apparatus for changing the pulse repetition rate of a pulse source comprising a recirculation storage device responsive to pulses from said pulse source to generate pulses at a different repetition rate, said recirculation storage device including retiming means, and means responsive to the pulses circulating in said recirculation storage device for selectively interrupting the recirculation path of said recirculation storage device for deleting spurious signals, and for indicating the occurrence of a spurious signal.

7. A system for changing the frequency of signals generated by a signal source comprising means for amplifying signals from said signal source, said amplifying means including reshaping and retiming means, feedback means for feeding a signal back from the output of said amplifying means to the input thereof, said feedback means comprising means for delaying said signal from said signal source and blocking means responsive to said signals for intermittently blocking said feedback means.

8. A system for changing the pulse repetition rate of pulses generated by a pulse signal source comprising means for amplifying and timing pulses from said pulse signal source, feedback means for feeding a signal back from output of said amplifying means to the input thereof, said feedback means comprising means for delaying said signal integral multiples of the period of signals from said signal source, and blocking means responsive to said signals for intermittently blocking said feedback means.

9. A system for changing the frequency of pulses generated by a pulse signal source comprising means for amplifying and timing pulses from said pulse signal source, feedback means for feeding a signal back from output of said amplifying means to the input thereof, said feedback means comprising means delaying said signal a fractional multiple of the period of signals from said pulse source and blocking means responsive to signals for intermittently blocking said feedback means.

10. A system for changing the frequency of pulses generated by a pulse source comprising means for amplifying, timing and shaping pulses from said pulse source, feedback means for feeding said pulses back from the output of said amplifying and timing means to the input thereof, said feedback means comprising means delaying said pulse multiples of the period of pulses from said pulse source and blocking means responsive to said pulses in said delaying means for selectively blocking said feedback means.

11. A system for changing the frequency of pulses generated by a pulse source comprising a reshaper for shaping and storing pulses from said pulse source, means for feeding said pulses back from the output of said reshaper to an input thereof, said feedback means comprising a delay line for delaying a pulse multiples of the period of pulses from said pulse source and a gate responsive to pulses in said delay line for blocking the action of said feedback means.

12. In a frequency changer employing a recirculating storage device having retiming means in which both desired and undesired signals can be present, apparatus for permitting only desired signals to circulate in said recirculating storage device comprising means responsive to the desired signals and for preventing the circulation of undesired signals.

13. In a frequency changer employing a recirculating storage device in which both desired and undesired pulse signals can be present, apparatus for permitting only desired signals to circulate in said recirculating storage device comprising control means responsive to the desired signals and deletion means responsive to said control means for preventing the continued recirculation of undesired signals.

14. Apparatus for permitting the storage of a predetermined constant number of pulses in a delay device with a capacity greater than the desired number of pulses to be stored comprising sampling means for determining the presence or absence of pulses at predetermined locations in said delay device and deleting means responsive to said sampling means for preventing the circulation of pulses in excess of the predetermined number.

15. Apparatus for permitting the storage of a single pulse in a delay device with a capacity of more than one pulse comprising means for inserting pulses into said delay device, sampling means for determining the presence or absence of pulses at predetermined locations in said delay device and deleting means responsive to said sampling means for selectively preventing the insertion of more than one pulse in said delay device.

16. Apparatus for insuring the circulation of a single pulse in a delay device capable of storing $n$ pulses comprising means for inserting pulses into said delay device, $(n-1)$ sampling terminals, said sampling terminals being so arranged to periodically receive pulses, and a control device responsive to pulses present at any of said sampling terminals for controlling the insertion of pulses.

17. Apparatus permitting the recirculation of only a single pulse in a recirculating storage device employing at least one regeneration unit and one delay unit serially connected to form a closed loop comprising a control device serially interposed in said closed loop, and sampling terminals for testing for the presence or absence of a pulse at predetermined positions in said recirculating storage device, said control device being responsive to signals from said sampling terminals for blocking and unblocking said closed loop.

18. Apparatus for permitting the storage of a single pulse in a recirculating storage device employing reshapers and delay lines arranged in a closed loop comprising: a gate having input and output terminals, said gate being serially interposed in said closed loop; a plurality of sample terminals connected to said delay lines; a buffer having input terminals respectively connected to said sample terminals, and an output terminal; and an amplifier having an input terminal connected to said output terminal of said buffer and an output terminal connected to an input terminal of said gate so that the presence or absence of pulses at said sample terminals cause the blocking or unblocking of said gate.

19. A system for changing the frequency of pulses generated by a first pulse source and synchronizing the frequency changed pulses to a second pulse source comprising amplifying means responsive to said first and second pulse source, means for feeding pulses back from the output of said amplifying means to the input thereof, said feedback means comprising means for delaying said pulses a multiple of the period of signals from said first pulse source and blocking means responsive to pulses in said delaying means for intermittently blocking said feedback means.

References Cited in the file of this patent

UNITED STATES PATENTS

| | | |
|---|---|---|
| 2,212,173 | Wheeler et al. | Aug. 20, 1940 |
| 2,482,973 | Gordon | Sept. 27, 1949 |
| 2,487,995 | Tucker | Nov. 15, 1949 |